US012785046B2

(12) United States Patent
Matsubara et al.

(10) Patent No.: US 12,785,046 B2
(45) Date of Patent: Nov. 3, 2026

(54) ETCHING METHOD AND PLASMA PROCESSING APPARATUS

(71) Applicant: Tokyo Electron Limited, Tokyo (JP)

(72) Inventors: Ryo Matsubara, Albany, NY (US); Koki Mukaiyama, Miyagi (JP); Maju Tomura, Miyagi (JP); Yoshihide Kihara, Miyagi (JP); Satoshi Ohuchida, Miyagi (JP); Takuto Kikuchi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 236 days.

(21) Appl. No.: 18/390,221

(22) Filed: Dec. 20, 2023

(65) Prior Publication Data

US 2024/0203698 A1 Jun. 20, 2024

(30) Foreign Application Priority Data

Dec. 20, 2022 (JP) ................................ 2022-203133
Oct. 24, 2023 (JP) ................................ 2023-182553

(51) Int. Cl.
*H01J 37/32* (2006.01)

(52) U.S. Cl.
CPC ... *H01J 37/32449* (2013.01); *H01J 2237/334* (2013.01)

(58) Field of Classification Search
None
See application file for complete search history.

(56) References Cited

U.S. PATENT DOCUMENTS

2016/0351407 A1* 12/2016 Sawataishi ............ H10P 50/242
2020/0035779 A1* 1/2020 Huang .................... H10D 1/692
2021/0233775 A1* 7/2021 Zhang .................... H10P 50/283
2022/0359167 A1* 11/2022 Orui .................. H01J 37/32568
2023/0207328 A1* 6/2023 Musselwhite ......... H10P 50/283
438/706
2024/0404833 A1* 12/2024 Gosset .................. H10P 50/242

FOREIGN PATENT DOCUMENTS

JP 2022-077710 A 5/2022

* cited by examiner

*Primary Examiner* — Binh X Tran
(74) *Attorney, Agent, or Firm* — XSENSUS LLP

(57) ABSTRACT

Provided is an etching method that includes: (a) preparing a substrate, the substrate including a first region and a second region below the first region, the first region containing a first material and having at least one opening, the second region containing a second material that is different from the first material and contains silicon; and (b) etching the second region through the at least one opening by using a plasma generated from a processing gas containing a fluorine containing gas and a $C_xH_yCl_z$ (x and y are each an integer of 0 or more, x+y≥1, and z is an integer of 1 or more) gas.

20 Claims, 17 Drawing Sheets

ETCHING METHOD AND PLASMA PROCESSING APPARATUS

CROSS-REFERENCE TO RELATED APPLICATIONS

This application is based upon and claiming the benefits of priorities from Japanese Patent Application No. 2022-203133, filed on Dec. 20, 2022 and Japanese Patent Application No. 2023-182553, filed on Oct. 24, 2023, the entire contents of each are incorporated herein by reference.

TECHNICAL FIELD

Exemplary embodiments of the present disclosure relate to an etching method and a plasma processing apparatus.

BACKGROUND

Patent Document 1 discloses an etching method. The etching method includes: (a) providing, in a chamber, a substrate having a silicon containing film including a silicon nitride film; and (b) generating a plasma from a processing gas in the chamber to etch the silicon containing film. The processing gas contains a fluorine containing gas and a boron containing gas.

CITATION LIST

Patent Documents

Patent Document 1: JP2022-077710A

SUMMARY

The present disclosure provides a technique capable of reducing an etching amount in a first region when a second region is etched through an opening of the first region.

In one exemplary embodiment, an etching method includes: (a) preparing a substrate, the substrate including a first region and a second region below the first region, the first region containing a first material and having at least one opening, the second region containing a second material that is different from the first material and contains silicon: and (b) etching the second region through the at least one opening by using a plasma generated from a processing gas containing a fluorine containing gas and a $C_xH_yCl_z$ (x and y are each an integer of 0 or more, x+y≥1, and z is an integer of 1 or more) gas.

According to one exemplary embodiment, a technique capable of reducing an etching amount in a first region when a second region is etched through an opening of the first region is provided.

DETAILED DESCRIPTION

Figure 1:
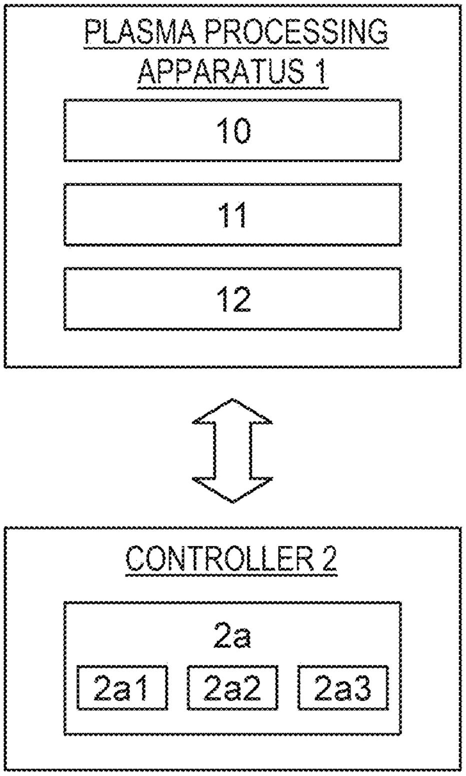
FIG. 1 is a diagram for explaining an example of a configuration of a plasma processing system.

Hereinafter, various exemplary embodiments will be described in detail with reference to the drawings. Further, like reference numerals will be given to like or corresponding parts throughout the drawings.

FIG. 1 is a diagram for explaining an example of a configuration of a plasma processing system. In an embodiment, a plasma processing system includes a plasma processing apparatus 1 and a controller 2. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. Further, the plasma processing chamber 10 has at least one gas supply port for supplying at least one processing gas into the plasma processing space, and at least one gas exhaust port for exhausting the gas from the plasma processing space. The gas supply port is connected to a gas supply 20 which will be described later, and the gas exhaust port is connected to an exhaust system 40 which will be described later. The substrate support 11 is disposed in the plasma processing space and has a substrate support surface for supporting the substrate.

The plasma generator 12 is configured to generate plasma from at least one processing gas supplied into the plasma processing space. The plasma formed in the plasma processing space may be capacitively coupled plasma (CCP), inductively coupled plasma (ICP), electron-cyclotron-resonance plasma (ECR plasma), helicon wave-excited plasma (HWP), surface wave plasma (SWP), or the like. Further, various types of plasma generators, including an alternating current (AC) plasma generator and a direct current (DC) plasma generator, may be used. In one embodiment, an AC signal (AC power) used by the AC plasma generator has a frequency in a range of 100 kHz to 10 GHz. Accordingly, the AC signal includes a radio frequency (RF) signal and a microwave signal. In one embodiment, the RF signal has a frequency in a range of 100 kHz to 150 MHZ.

The controller 2 processes computer-executable instructions for instructing the plasma processing apparatus 1 to execute various steps described herein below. The controller 2 may be configured to control the respective components of the plasma processing apparatus 1 to execute the various steps described herein below: In an embodiment, part or all of the controller 2 may be included in the plasma processing apparatus 1. The controller 2 may include a processor 2*a*1, a storage unit 2*a*2, and a communication interface 2*a*3. The controller 2 is implemented by, for example, a computer 2*a*. The processor 2*a*1 may be configured to read a program from the storage unit 2*a*2 and perform various control operations by executing the read program. The program may be stored in advance in the storage unit 2*a*2, or may be acquired via a medium when necessary. The acquired program is stored in the storage unit 2*a*2, and is read from the storage unit 2*a*2 and executed by the processor 2*a*1. The medium may be various storing media readable by the computer 2*a*, or may be a communication line connected to the communication interface 2*a*3. The processor 2*a*1 may be a Central Processing Unit (CPU). The storage unit 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 via a communication line such as a local area network (LAN).

Figure 2:
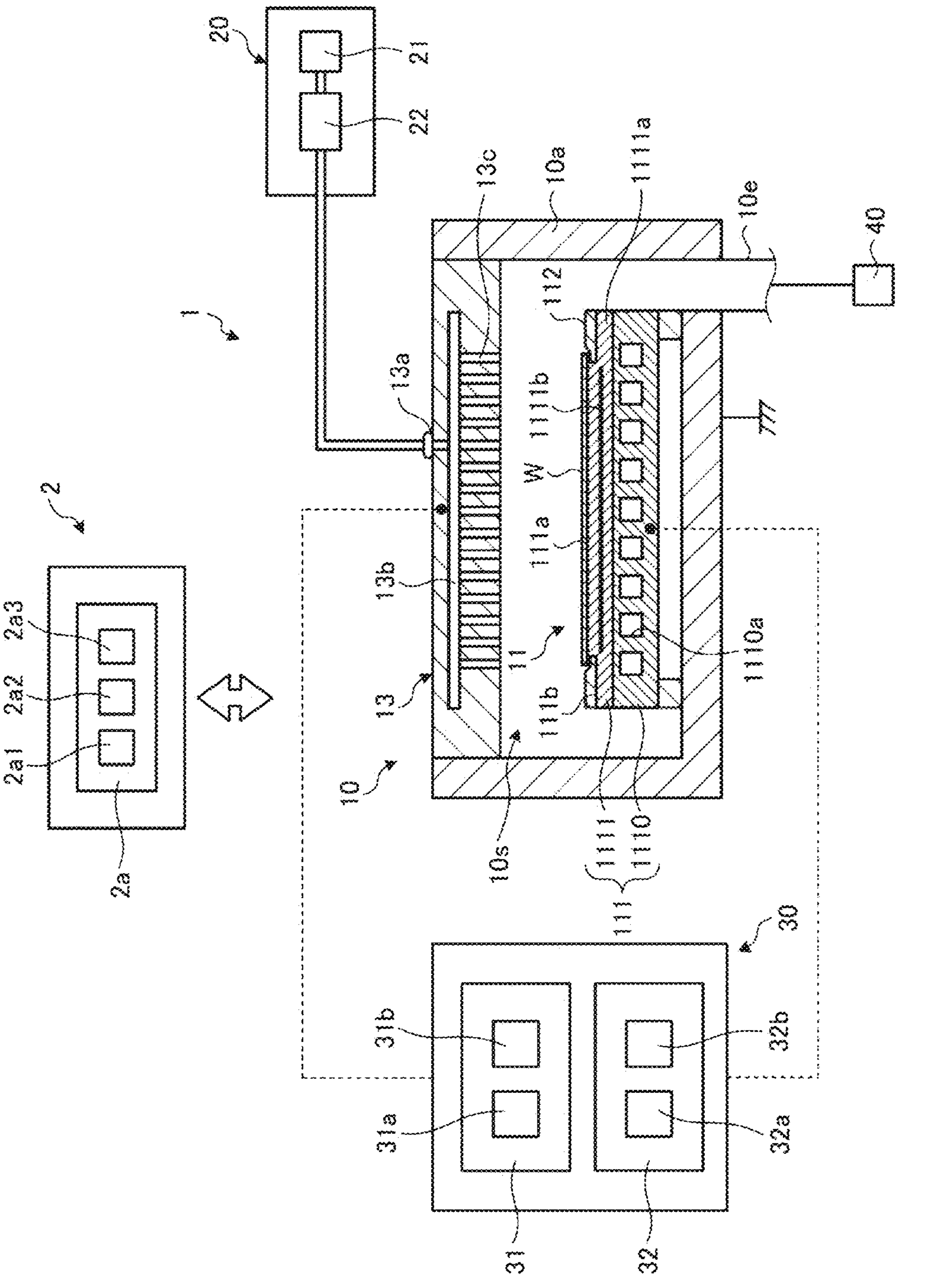
FIG. 2 is a view for explaining an example of a configuration of a capacitively-coupled plasma processing apparatus.

Hereinafter, a configuration example of a capacitively-coupled plasma processing apparatus as an example of the plasma processing apparatus 1 will be described. FIG. 2 is a view for explaining an example of a configuration of a capacitively-coupled plasma processing apparatus.

The capacitively-coupled plasma processing apparatus 1 includes the plasma processing chamber 10, the gas supply 20, a power source 30, and the exhaust system 40. Further, the plasma processing apparatus 1 includes the substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space 10*s* defined by the shower head 13, a sidewall 10*a* of the plasma processing chamber 10, and the substrate support 11. The plasma processing chamber 10 is grounded. The shower head 13 and the substrate support 11 are electrically insulated from a housing of the plasma processing chamber 10.

The substrate support 11 includes a main body 111 and a ring assembly 112. The main body 111 has a central region 111*a* for supporting a substrate W and an annular region 111*b* for supporting the ring assembly 112. A wafer is an example of the substrate W. The annular region 111*b* of the main body 111 surrounds the central region 111*a* of the main body 111 in a plan view: The substrate W is disposed on the central region 111*a* of the main body 111 and the ring assembly 112 is disposed on the annular region 111*b* of the main body 111 to surround the substrate W on the central region 111*a* of the main body 111. Accordingly, the central region 111*a* is also referred to as a substrate support surface for supporting the substrate W. and the annular region 111*b* is also referred to as a ring support surface for supporting the ring assembly 112.

In one embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 111*a* and an electrostatic electrode 1111*b* disposed in the ceramic member 1111*a*. The ceramic member 1111*a* has the central region 111*a*. In one embodiment, the ceramic member 1111*a* also has the annular region 111*b*. Other members that surround the electrostatic chuck 1111, such as an annular electrostatic chuck and an annular insulating member, may have the annular region 111*b*. In this case, the ring assembly 112 may be disposed on the annular electrostatic chuck or the annular insulating member, or may be disposed on both the electrostatic chuck 1111 and the annular insulating member. Further, at least one RF/DC electrode coupled to an RF power source 31 and/or a DC power source 32 to be described later may be disposed in the ceramic member 1111*a*. In this case, at least one RF/DC electrode functions as the lower electrode. In a case where the bias RF signal and/or the DC signal to be described later are supplied to at least one RF/DC electrode, the RF/DC electrode is also referred to as a bias electrode. The conductive member of the base 1110 and at least one RF/DC electrode may function as a plurality of lower electrodes. Further, the electrostatic electrode 1111*b* may function as the lower electrode. Accordingly, the substrate support 11 includes at least one lower electrode.

The ring assembly 112 includes one or more annular members. In one embodiment, one or more annular members include one or more edge rings and at least one cover ring. The edge ring is formed of a conductive material or an insulating material, and the cover ring is formed of an insulating material.

Further, the substrate support 11 may include a temperature control module configured to adjust at least one of the electrostatic chuck 1111, the ring assembly 112, and the substrate to a target temperature. The temperature control module may include a heater, a heat transfer medium, a flow path 1110*a*, or a combination thereof. A heat transfer fluid, such as brine or gas, flows through the flow path 1110*a*. In one embodiment, the flow path 1110*a* is formed inside the base 1110, and one or more heaters are disposed in the ceramic member 1111*a* of the electrostatic chuck 1111. Further, the substrate support 11 may include a heat transfer gas supply configured to supply a heat transfer gas to a gap between a rear surface of the substrate W and the central region 111*a*.

The shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. Further, the shower head 13 includes at least one upper electrode. The gas introduction unit may include, in addition to the shower head 13, one or a plurality of side gas injectors (SGI) that are attached to one or a plurality of openings formed in the sidewall 10*a*.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include at least one flow rate modulation device that modulates or pulses the flow rate of at least one processing gas.

The power source 30 includes the RF power source 31 coupled to the plasma processing chamber 10 via at least one impedance matching circuit. The RF power source 31 is configured to supply at least one RF signal (RF power) to at least one lower electrode and/or at least one upper electrode. As a result, plasma is formed from at least one processing gas supplied into the plasma processing space 10*s*. Accordingly, the RF power source 31 may function as at least a part of the plasma generator 12. Further, supplying the bias RF signal to at least one lower electrode can generate a bias potential in the substrate W to attract an ionic component in the formed plasma to the substrate W.

In one embodiment, the RF power source 31 includes a first RF generator 31*a* and a second RF generator 31*b*. The first RF generator 31*a* is configured to be coupled to at least one lower electrode and/or at least one upper electrode via at least one impedance matching circuit to generate a source RF signal (source RF power) for plasma generation. In one embodiment, the source RF signal has a frequency in the range of 10 MHz to 150 MHZ. In one embodiment, the first RF generator 31*a* may be configured to generate a plurality of source RF signals having different frequencies. The generated one or more source RF signals are supplied to at least one lower electrode and/or at least one upper electrode.

The second RF generator 31*b* is configured to be coupled to at least one lower electrode via at least one impedance matching circuit to generate the bias RF signal (bias RF power). A frequency of the bias RF signal may be the same as or different from a frequency of the source RF signal. In one embodiment, the bias RF signal has a lower frequency than the frequency of the source RF signal. In one embodiment, the bias RF signal has a frequency in the range of 100 kHz to 60 MHz. In one embodiment, the second RF generator 31*b* may be configured to generate a plurality of bias RF signals having different frequencies. The generated one or more bias RF signals are supplied to at least one lower electrode. Further, in various embodiments, at least one of the source RF signal and the bias RF signal may be pulsed.

Further, the power source 30 may include the DC power source 32 coupled to the plasma processing chamber 10. The DC power source 32 includes a first DC generator 32*a* and a second DC generator 32*b*. In one embodiment, the first DC generator 32*a* is configured to be connected to at least one lower electrode to generate a first DC signal. The generated first DC signal is applied to at least one lower electrode. In one embodiment, the second DC generator 32*b* is configured to be connected to at least one upper electrode to generate a second DC signal. The generated second DC signal is applied to at least one upper electrode.

In various embodiments, the first and second DC signals may be pulsed. In this case, the sequence of voltage pulses is applied to at least one lower electrode and/or at least one upper electrode. The voltage pulse may have a pulse waveform of a rectangle, a trapezoid, a triangle or a combination thereof. In one embodiment, a waveform generator for generating a sequence of voltage pulses from the DC signal is connected between the first DC generator 32*a* and at least one lower electrode. Accordingly, the first DC generator 32*a* and the waveform generator configure a voltage pulse generator. In a case where the second DC generator 32*b* and the waveform generator configure the voltage pulse generator, the voltage pulse generator is connected to at least one upper electrode. The voltage pulse may have a positive polarity or a negative polarity. Further, the sequence of the voltage pulses may include one or more positive voltage pulses and one or more negative voltage pulses in one cycle. The first and second DC generators 32*a* and 32*b* may be provided in addition to the RF power source 31, and the first DC generator 32*a* may be provided instead of the second RF generator 31*b*.

The exhaust system 40 may be connected to, for example, a gas exhaust port 10*e* disposed at a bottom portion of the plasma processing chamber 10. The exhaust system 40 may include a pressure adjusting valve and a vacuum pump. The pressure in the plasma processing space 10*s* is adjusted by the pressure adjusting valve. The vacuum pump may include a turbo molecular pump, a dry pump, or a combination thereof.

Figure 3:
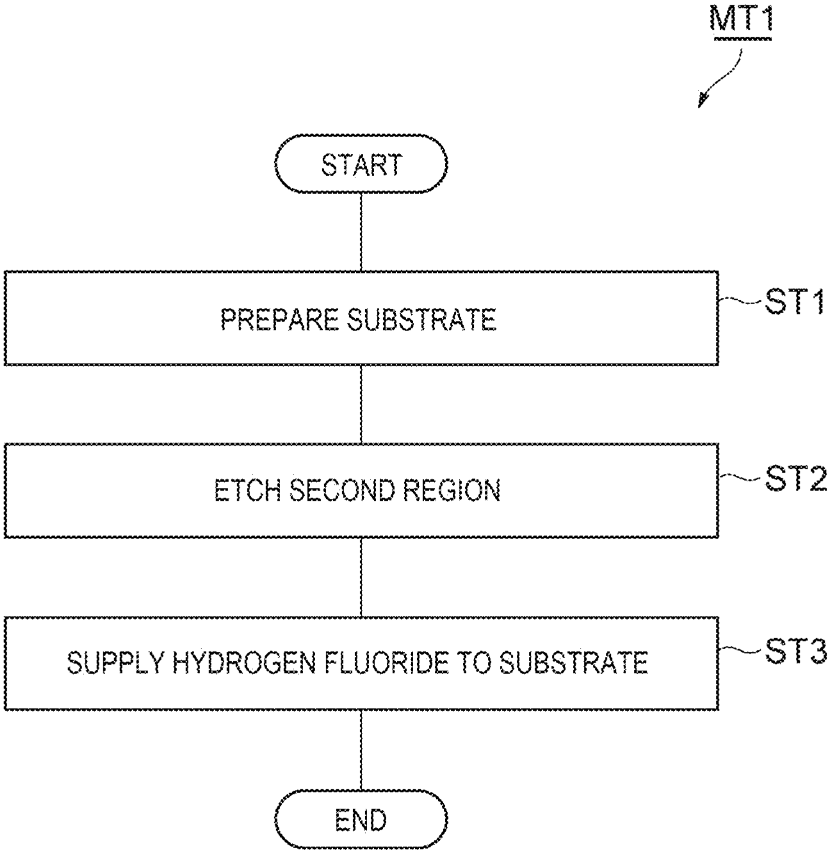
FIG. 3 is a flowchart of an etching method according to one exemplary embodiment.

FIG. 3 is a flowchart of a substrate processing method according to one exemplary embodiment. A substrate processing method MT1 illustrated in FIG. 3 (hereinafter referred to as a "method MT1") may be executed by the plasma processing apparatus 1 in the embodiment. The method MT1 may be applied to the substrate W.

Figure 6:
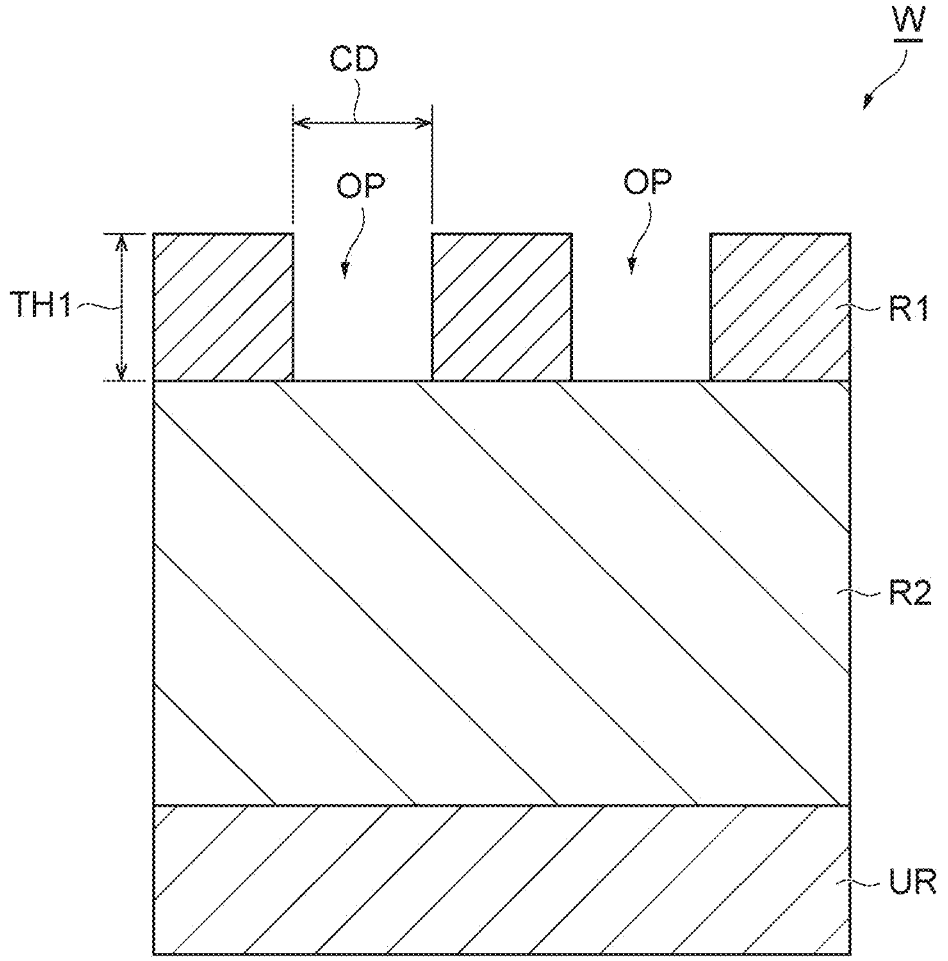
FIG. 6 is a partially enlarged cross-sectional view of an example of a substrate to which the method of FIG. 3 may be applied.

FIG. 6 is a partially enlarged cross-sectional view of an example of a substrate to which the method of FIG. 3 may be applied. As illustrated in FIG. 6, in one embodiment, the substrate W includes a first region R1 and a second region R2 below the first region R1. The substrate W may further include an underlayer region UR below the second region R2.

The first region R1 has at least one opening OP. The first region R1 may have openings OP. The opening OP may have a hole pattern or a line pattern. A dimension critical dimension (CD) of the opening OP may be 5 nm or more, 10 nm or more, or 20 nm or more. The dimension CD of the opening OP may be 200 nm or less, 180 nm or less, 150 nm or less, 100 nm or less, or 50 nm or less. The first region R1 may be a mask. The first region R1 may have a first thickness TH1 of 500 nm or more.

The first region R1 contains a first material. The first material may contain at least one selected from the group consisting of carbon, silicon, and a metal. The first material may contain a metal. The first material may contain at least one metal selected from the group consisting of ruthenium, tungsten, titanium, and molybdenum. The first material may contain a metal silicide. The first region R1 may include at least one selected from the group consisting of a carbon containing film, a silicon containing film, and a metal containing film. The carbon containing film may be an amorphous carbon film. The silicon containing film may be a polysilicon film or a boron containing silicon film. The metal containing film may contain at least one selected from the group consisting of nitrogen and carbon. The metal containing film may be a tungsten containing film. The tungsten containing film may be a tungsten silicide (WSi) film, a tungsten silicide nitride ($WSi_xN_y$) film, or a tungsten carbide (WC) film. x and y are positive real numbers.

The second region R2 contains a second material different from the first material. The second material contains silicon. The second material may contain, in addition to silicon, at least one selected from the group consisting of nitrogen and oxygen. The second material may contain at least one selected from the group consisting of a silicon nitride ($SiN_x$), a silicon oxide ($SiO_x$), and a silicon oxynitride (SiON). x is a positive real number. The second region R2 may be a single-layer film or a stacked film. The second region R2 may be a stacked film in which a silicon nitride film and a silicon oxide film are alternately stacked. The second region R2 may have a thickness of 600 nm or more. The second region R2 may include at least two layers selected from the group consisting of a first silicon containing layer, a second silicon containing layer, and a third silicon containing layer. The first silicon containing layer may contain silicon and nitrogen. The second silicon containing layer may contain silicon and oxygen. The third silicon containing layer may contain polysilicon.

The underlayer region UR contains a third material different from the first material and the second material. The third material may contain a metal or silicon. The third material may contain at least one selected from the group consisting of a silicon nitride, a silicon oxide, and a silicon oxynitride. The underlayer region UR may include at least one film for a memory device such as a DRAM or a 3D-NAND.

Figure 4:
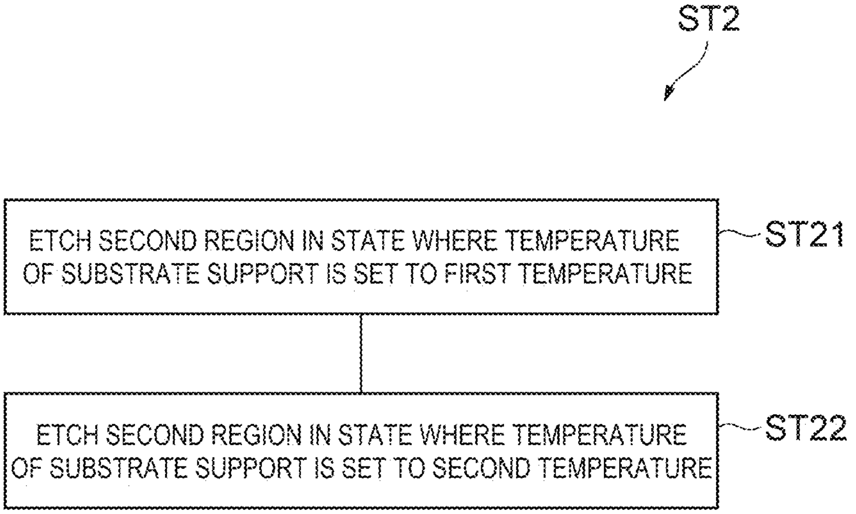
FIG. 4 is a flowchart illustrating an example of one step in the method of FIG. 3.
Figure 5:
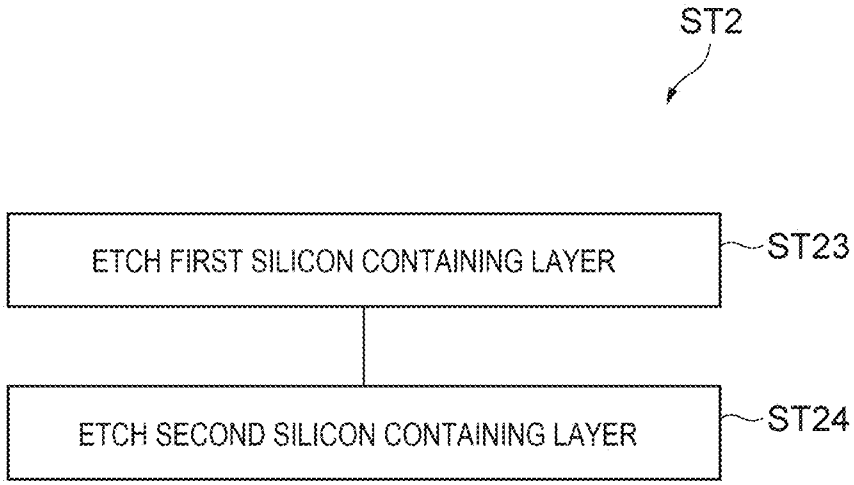
FIG. 5 is a flowchart illustrating another example of the one step in the method of FIG. 3.
Figure 7:
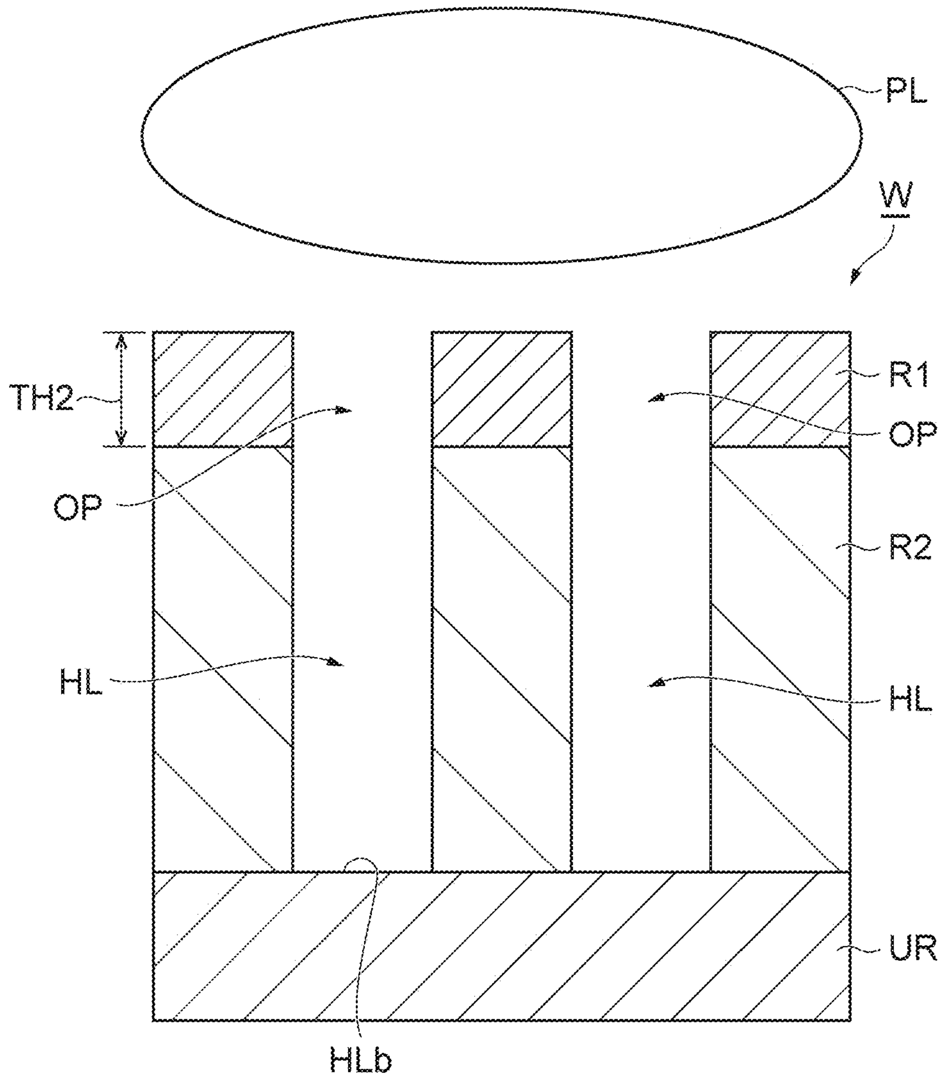
FIG. 7 is a cross-sectional view illustrating a step in the etching method according to one exemplary embodiment.

Hereinafter, the method MT1 will be described by taking as an example a case where the method MT1 is applied to the substrate W using the plasma processing apparatus 1 of the embodiment described above, with reference to FIGS. 3 to 7. FIGS. 4 and 5 are flowcharts illustrating examples of one step in the method of FIG. 3. FIG. 7 is a cross-sectional view illustrating a step in the etching method according to one exemplary embodiment. In a case where the plasma processing apparatus 1 is used, the method MT1 may be performed in the plasma processing apparatus 1 under the control of each part of the plasma processing apparatus 1 by the controller 2. In the method MT1, as illustrated in FIG. 2, the substrate W on the substrate support 11 disposed in the plasma processing chamber 10 is processed.

As illustrated in FIG. 3, the method MT1 may include Step ST1, Step ST2, and Step ST3. Step ST1 to Step ST3 may be performed sequentially. The method MT1 may not include Step ST3.

Step ST1

In Step ST1, the substrate W illustrated in FIG. 6 is prepared. The substrate W may be supported by the substrate support 11 in the plasma processing chamber 10.

Step ST2

In Step ST2, as illustrated in FIG. 7, the second region R2 is etched through the opening OP by using a plasma PL generated from a processing gas. Accordingly, a recess HL is formed in the second region R2. The recess HL corresponds to the opening OP. The recess HL may be, for example, a circular hole or a trench. A bottom HLb of the recess HL may reach the underlayer region UR or may be separated from the underlayer region UR. The supply of the processing gas may be stopped at an end of Step ST2. In Step ST2, bias power may be supplied to the substrate support 11.

In a first example, the processing gas in Step ST2 may contain a fluorine containing gas and a $C_xH_yCl_z$ (x and y are each an integer of 0 or more, x+y≥1, and z is an integer of 1 or more) gas. The $C_xH_yCl_z$ gas may contain at least one selected from the group consisting of a hydrogen chloride (HCl) gas, a dichloromethane ($CH_2Cl_2$) gas, and a chloroform ($CHCl_3$) gas. The fluorine containing gas may contain at least one selected from the group consisting of a hydrogen fluoride (HF) gas, a fluorocarbon ($C_xF_y$) gas, a hydrofluorocarbon ($C_xH_yF_z$) gas, a bromofluorocarbon ($C_xBr_yF_z$) gas, and a phosphorus fluoride gas. The fluorocarbon ($C_xF_y$) gas may contain at least one selected from the group consisting of a $CF_4$ gas, a $C_3F_6$ gas, a $C_3F_8$ gas, a $C_4F_6$ gas, and a $C_4F_8$ gas. The hydrofluorocarbon ($C_xH_yF_z$) gas may contain at least one selected from the group consisting of a $CH_2F_2$ gas, a $CHF_3$ gas, and a $CH_3F$ gas. The bromofluorocarbon ($C_xBr_yF_z$) gas may contain a $CBr_2F_2$ gas. x, y, and z are natural numbers. The phosphorus fluoride gas may contain at least one selected from the group consisting of a $PF_3$ gas and a $PF_5$ gas.

In a second example, the processing gas in Step ST2 may contain the $C_xH_yCl_z$ (x and y are each an integer of 0 or more, x+y≥1, and z is an integer of 1 or more) gas and a hydrogen halide gas different from the hydrogen chloride gas. The hydrogen halide gas may contain at least one selected from the group consisting of a hydrogen fluoride (HF) gas, a hydrogen bromide (HBr) gas, and a hydrogen iodide (HI) gas. The hydrogen halide gas may contain at least one selected from the group consisting of a hydrogen fluoride gas and a hydrogen bromide gas.

In a third example, the processing gas in Step ST2 may contain a fluorine containing gas and a compound having an interatomic bond having a bonding energy larger than a bonding energy between a chlorine atom and a chlorine atom. Examples of the compound include HCl, HBr, and HI. The compound may be a chlorine containing compound. Examples of the chlorine containing compound include HCl, $SiCl_4$, $PCl_3$, $CHCl_3$, $POCl_3$, and $ClF_3$.

In Step ST2, the processing gas may further contain a noble gas.

In Step ST2, a proportion of a flow rate of the $C_xH_yCl_z$ gas to a total flow rate of the processing gas may be 0.5 vol % to 30 vol %.

After Step ST2, the first region R1 may have a second thickness TH2. The second thickness TH2 may be smaller than the first thickness TH1. Before Step ST2, the first region R1 may have the first thickness TH1. A ratio of the second thickness TH2 to the first thickness TH1 may be 0.4 to 0.9.

In Step ST2, a temperature of the substrate support 11 may be −80° C. or higher, or −60° C. or higher. In Step ST2, the temperature of the substrate support 11 may be 100° C. or lower, 50° C. or lower, 30° C. or lower, or 20° C. or lower. In Step ST2, the temperature of the substrate support 11 may be −80° C. to 50° C., or −60° C. to 20° C. Step ST2 may be started in a state where the temperature of the substrate support 11 is set to 0° C. or lower. When Step ST2 is performed at a low temperature, an etching rate of the second region R2 containing silicon and nitrogen is improved compared to a case where the processing gas does not contain the $C_xH_yCl_z$ gas.

As illustrated in FIG. 4, Step ST2 may include Step ST21 and Step ST22. Step ST21 may be performed after Step ST1. Step ST22 may be performed after Step ST21. In Step ST21, the second region R2 is etched in a state where the temperature of the substrate support 11 is set to a first temperature. In Step ST22, the second region R2 is etched in a state where the temperature of the substrate support 11 is set to a second temperature different from the first temperature. The first temperature may be lower than or higher than the second temperature. When the first temperature is lower than the second temperature, an etching selectivity of the second region R2 to the underlayer region UR may be improved. Step ST21 and Step ST22 may be alternately repeated.

The temperature of the substrate support 11 may be adjusted by the temperature control module. The temperature control module may include a heater, a heat transfer medium, the flow path 1110*a*, or a combination thereof. The temperature of the substrate support 11 may be adjusted by a pressure of the heat transfer gas supplied to the gap between the rear surface of the substrate W and the central region 111*a*. The temperature of the substrate support 11 may be adjusted by a voltage applied to the electrostatic chuck 1111. When a high voltage is applied to the electrostatic chuck 1111, an attraction force is improved. Therefore, a heat transfer property between the substrate W and the heat transfer gas and a heat transfer property between the heat transfer gas and the substrate support 11 are improved. The temperature of the substrate support 11 may be adjusted by a heating device such as an infrared lamp.

As illustrated in FIG. 5, Step ST2 may include Step ST23 and Step ST24. Step ST23 may be performed after Step ST1. Step ST24 may be performed after Step ST23. In Step ST23, the first silicon containing layer is etched by using a plasma generated from a first processing gas containing the fluorine containing gas and the $C_xH_yCl_z$ gas. The first silicon containing layer is included in the second region R2. In Step ST24, the second silicon containing layer is etched by using a second processing gas containing the fluorine containing gas. The second silicon containing layer is included in the second region R2. The second silicon containing layer may be below the first silicon containing layer. The second processing gas may not contain the $C_xH_yCl_z$ gas, or may contain the $C_xH_yCl_z$ gas having a flow rate smaller than a flow rate of the $C_xH_yCl_z$ gas contained in the first processing gas.

Step ST3

In Step ST3, hydrogen fluoride may be supplied to the substrate W. Accordingly, a deposit that adheres to the opening OP in Step ST2 can be removed. The deposit may contain an element contained in the second region R2. The hydrogen fluoride may be a hydrogen fluoride gas or hydrofluoric acid. In one exemplary embodiment, a processing gas containing the hydrogen fluoride gas is supplied into the plasma processing chamber 10. Hydrogen fluoride molecules in the hydrogen fluoride gas react with the deposit, and thereby reaction products such as silicon fluoride may be generated. The deposit may be removed by volatilization of the reaction products. The plasma may not be generated from the processing gas. In this case, the etching of the first region R1 by the plasma can be prevented. As a result, deformation of the first region R1 can be prevented. The plasma may be generated from the processing gas. In this case, source radio-frequency power may be 1000 W or less, and the bias power supplied to the substrate support 11 may be 0 W.

The processing gas in Step ST3 may further contain a hydrogen containing gas. Accordingly, the hydrogen containing gas may be supplied to the first region R1. The hydrogen containing gas may contain oxygen. Examples of the hydrogen containing gas include water or steam ($H_2O$), a $C_xH_yO_z$ gas (x≥0, and y and z≥1) such as methanol ($CH_3OH$), ethanol ($C_2H_5OH$), and acetic acid ($CH_3COOH$), phosphoric acid ($H_3PO_4$), sulfuric acid ($H_2SO_4$), hydrogen peroxide ($H_2O_2$), nitric acid ($HNO_3$), and ammonia ($NH_3$). The processing gas may further contain a noble gas. A flow rate of the hydrogen fluoride gas may be the largest among the gases contained in the processing gas.

A pressure in Step ST3 may be 13.3 Pa (100 mTorr) or more, or 40 Pa (300 mTorr) or more. The pressure in Step ST3 may be less than or equal to a saturated vapor pressure of hydrogen fluoride. The pressure in Step ST3 may be $1.33\times10^5$ Pa (1000 Torr) or less, 133 Pa (1 Torr) or less, 120 Pa (900 mTorr) or less, or 107 Pa (800 mTorr) or less. The pressure in Step ST3 may be 13.3 Pa (100 mTorr) to 133 Pa (1 Torr), or 40 Pa (300 mTorr) to 107 Pa (800 mTorr).

An example of the temperature of the substrate support 11 in Step ST3 may be the same as the example of the temperature of the substrate support 11 in Step ST2.

A duration time of Step ST3 may be 1 second or longer. 10 seconds or longer, or 1 minute or longer. The duration time of Step ST3 may be 10 minutes or shorter, 5 minutes or shorter, or 3 minutes or shorter.

According to the method MT1, in Step ST2, an etching amount of the first region R1 can be reduced. A mechanism may be considered as follows, and is not limited thereto. A bonding energy between a hydrogen atom (H) and the chlorine atom (Cl) and a bonding energy between a carbon atom (C) and the chlorine atom (Cl) are larger than the bonding energy between the chlorine atom (Cl) and the chlorine atom (Cl). Therefore, chlorine radicals caused by dissociation of the $C_xH_yCl_z$ gas such as the hydrogen chloride (HCl) gas are unlikely to be generated in the plasma PL. The chlorine radicals promote the etching of the first region R1. Since a generation amount of the chlorine radicals in the plasma PL generated from the $C_xH_yCl_z$ gas is smaller than a generation amount of chlorine radicals in a plasma generated from a chlorine ($Cl_2$) gas, the etching amount and the etching rate of the first region R1 can be reduced. Accordingly, the etching selectivity of the second region R2 to the first region R1 can be improved.

According to the method MT1, blockage of the opening OP can be prevented. A mechanism by which the blockage of the opening OP is prevented may be considered as follows, and is not limited thereto. A chlorine containing active species in the plasma PL reacts with the deposit that adheres to the opening OP, and the deposit is volatilized. When the blockage of the opening OP is prevented, an increase in roughness of a sidewall of the recess HL is also prevented.

According to the method MT1, a shape abnormality of the recess HL can be prevented. Examples of the shape abnormality of the recess HL include a decrease in roundness and bending of a recess. The bending of the recess is a phenomenon in which a misalignment amount of a midpoint of a width of the recess from a central reference line of the recess is increased as the recess is deeper in a cross section (cross section in FIG. 7) taken along a depth direction of the recess. The central reference line of the recess extends in the depth direction of the recess through the midpoint of the width of the recess at an upper end of the recess. The mechanism by which the shape abnormality of the recess HL is prevented may be considered as follows, and is not limited thereto. Most of ions (for example, $Cl^+$ ions and $HCl^+$ ions) in the plasma PL reach the bottom HLb of the recess HL. When the bias power is supplied to the substrate support 11 in Step ST2, straightness of the ions is improved, and therefore more ions reach the bottom HLb of the recess HL. Accordingly, since the etching of the sidewall of the recess HL is prevented, the shape abnormality of the recess HL is prevented.

Figure 8:
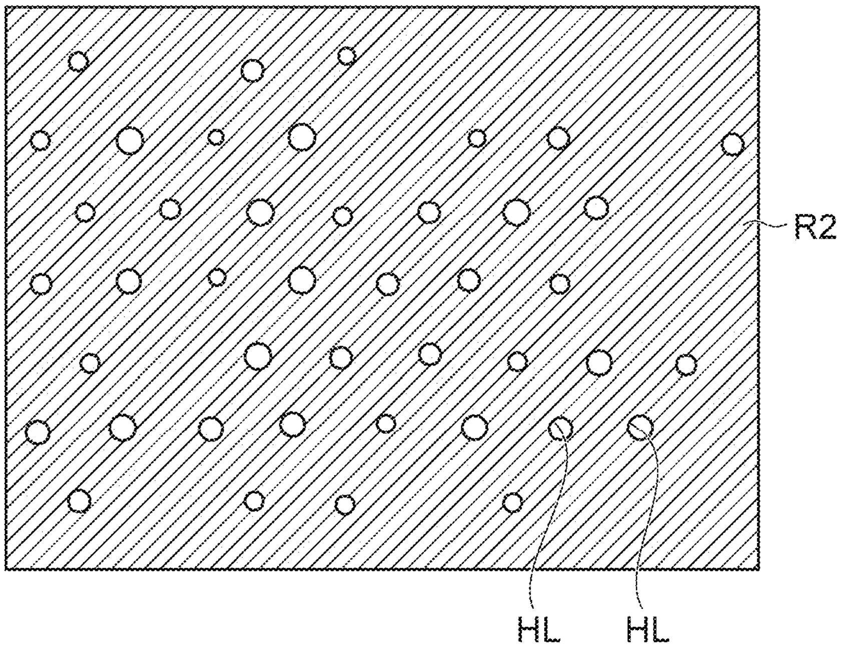
FIG. 8 is a partially enlarged cross-sectional view of the substrate orthogonal to a depth direction of holes formed in a second region by the etching method according to one exemplary embodiment.

FIG. 8 is a partially enlarged cross-sectional view of the substrate orthogonal to a depth direction of holes formed in a second region by the etching method according to one exemplary embodiment. FIG. 8 illustrates a cross section orthogonal to the depth direction of the recess HL. FIG. 8 illustrates a cross section in vicinity of an interface (the bottom HLb of the recess HL) between the second region R2 and the underlayer region UR. The roundness in the present embodiment may be measured in the cross section in FIG. 8 or may be measured in other cross sections. The roundness may be measured in any one of cross sections orthogonal to the depth direction of the recess HL in the second region R2.

As illustrated in FIG. 8, the recess HL may be a circular hole. In the cross section in FIG. 8, the roundness of the recess HL may be 0.95 to 1, or may be 0.977 to 1. The measurement of the roundness of the recess HL is performed by using an image of the recess HL in the cross section in FIG. 8. Roundness C of each recess HL is calculated based on the following equation. S is an area of each recess HL. P is a length of an outer periphery of each recess HL. $C=4\pi\times S/P^2$ When there are recesses HL, a median value in a distribution of the roundness measured for the recesses HL is the roundness of the recess HL.

While various exemplary embodiments have been described above, various additions, omissions, substitutions and changes may be made without being limited to the exemplary embodiments described above. Also, the other embodiments may be formed by combining elements in different embodiments.

Hereinafter, various experiments performed to evaluate the method MT1 will be described. The following experiments are not intended to limit the present disclosure.

First Experiment

In a first experiment, a substrate including a stacked film in which a silicon oxide film and a silicon nitride film were alternately stacked and a mask on the stacked film was prepared. The mask is an amorphous carbon film having a circular opening. Thereafter, Step ST2 was performed on the substrate by using a plasma processing apparatus.

In Step ST2, the stacked film was etched through the opening in the mask by using a plasma generated from a processing gas. The processing gas contains a fluorine containing gas, an HCl gas, and an argon (Ar) gas. The fluorine containing gas contains an HF gas, a phosphorus fluoride gas, and a bromofluorocarbon gas. A proportion of a flow rate of the HCl gas to a total flow rate of the processing gas is 0.9 vol %.

Second Experiment

In a second experiment, a method same as that in the first experiment was performed except that the proportion of the flow rate of the HCl gas to the total flow rate of the processing gas was 1.8 vol %.

Third Experiment

In a third experiment, a method same as that in the first experiment was performed except that the proportion of the flow rate of the HCl gas to the total flow rate of the processing gas was 5.3 vol %.

Fourth Experiment

In a fourth experiment, a method same as that in the first experiment was performed except that the proportion of the flow rate of the HCl gas to the total flow rate of the processing gas was 10 vol %.

Fifth Experiment

In a fifth experiment, a method same as that in the first experiment was performed except that the flow rate of the HCl gas was 0 sccm.

Sixth Experiment

In a sixth experiment, a method same as that in the fifth experiment was performed except that the processing gas contained a $Cl_2$ gas and a proportion of a flow rate of the $Cl_2$ gas to the total flow rate of the processing gas was 0.9 vol %.

Seventh Experiment

In a seventh experiment, a method same as that in the sixth experiment was performed except that the proportion of the flow rate of the $Cl_2$ gas to the total flow rate of the processing gas was 1.8 vol %.

Eighth Experiment

In an eighth experiment, a method same as that in the sixth experiment was performed except that the proportion of the flow rate of the $Cl_2$ gas to the total flow rate of the processing gas was 3.6 vol %.

First Experiment Result

Figure 9:
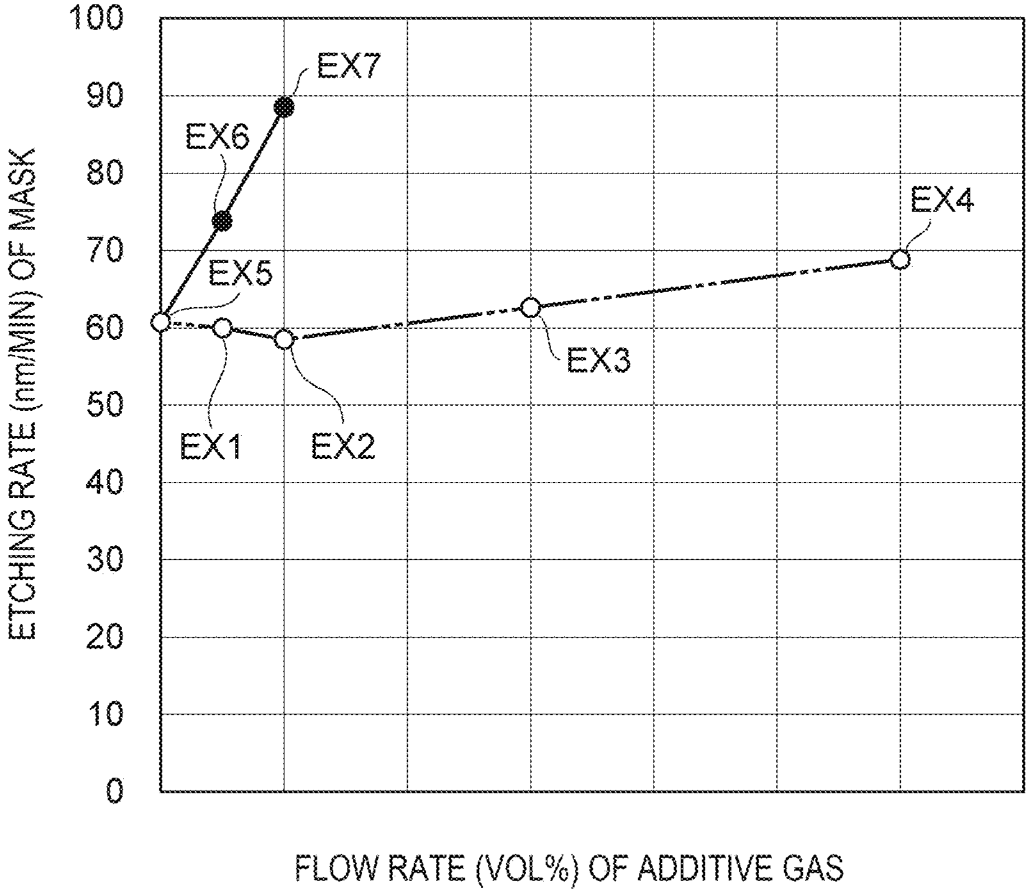
FIG. 9 is a graph illustrating an example of a correlation between a flow rate of an additive gas contained in a processing gas and an etching rate of a mask.

In the first experiment to the seventh experiment, an etching rate (nm/min) of the mask was calculated by measuring a difference between a first thickness of the mask before the etching and a second thickness of the mask after the etching. Results are illustrated in FIG. 9. In the first experiment to the fourth experiment, a ratio of the second thickness to the first thickness was 0.77 to 0.8.

FIG. 9 is a graph illustrating an example of a correlation between a flow rate of an additive gas contained in a processing gas and an etching rate of a mask. A horizontal axis of the graph represents the flow rate (vol %) of the additive gas contained in the processing gas. A vertical axis of the graph represents the etching rate (nm/min) of the mask. In the graph, plots EX1 to EX7 represent the results of the first experiment to the seventh experiment, respectively. In the first experiment to the fourth experiment, the additive gas is the HCl gas. In the sixth experiment and the seventh experiment, the additive gas is the $Cl_2$ gas.

As can be understood from the plots EX1 to EX5, the etching rate of the mask is not so large even when the flow rate of the HCl gas is increased. Meanwhile, as can be understood from the plots EX5 to EX7, when the flow rate of the $Cl_2$ gas is increased, the etching rate of the mask is rapidly increased.

Therefore, it is understood that when the processing gas contains the HCl gas, the etching amount of the mask can be prevented compared to a case where the processing gas contains the $Cl_2$ gas.

Second Experiment Result

In the first experiment to the eighth experiment, images of the cross section (cross section in FIG. 8) orthogonal to the depth direction of the holes were observed at the bottom of the circular holes formed in the stacked film by the etching. The roundness of the holes was measured in the cross section, and the median value in the distribution of the roundness measured for the holes was defined as the roundness of the hole. Results are illustrated in FIG. 10.

Figure 10:
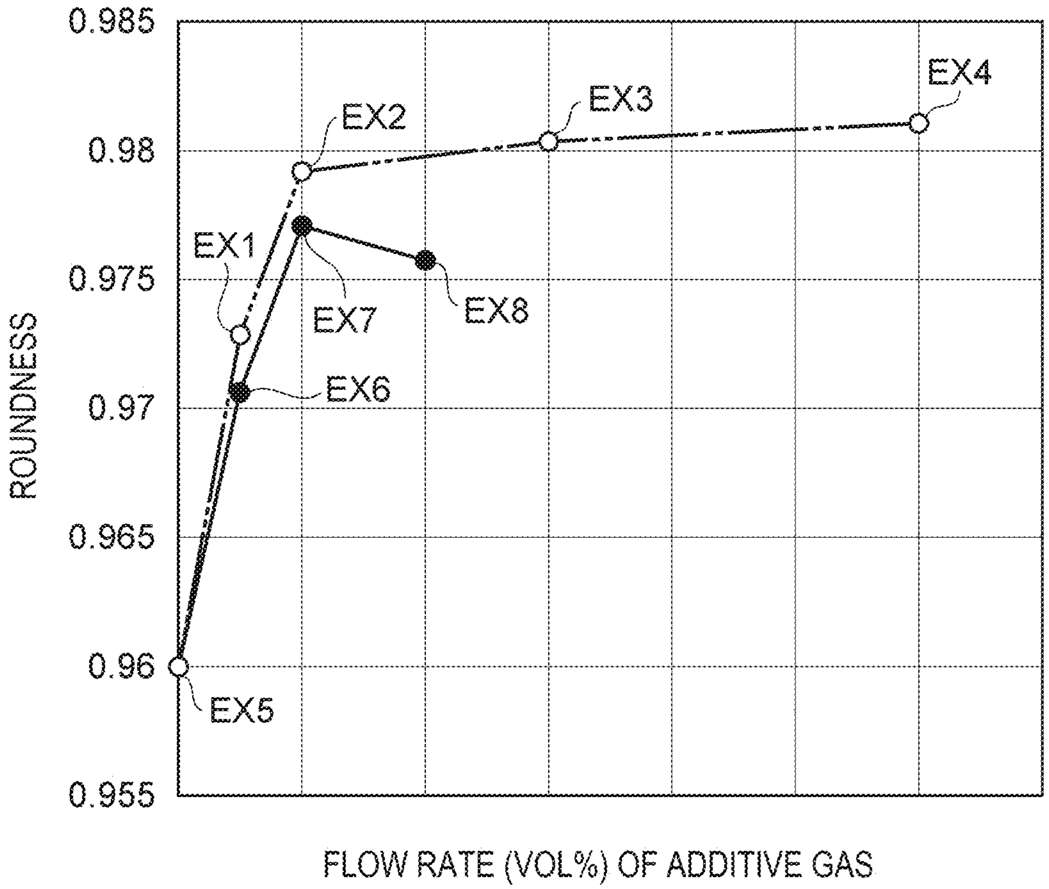
FIG. 10 is a graph illustrating an example of a correlation between the flow rate of the additive gas contained in the processing gas and roundness.

FIG. 10 is a graph illustrating an example of a correlation between the flow rate of the additive gas contained in the processing gas and roundness. A horizontal axis of the graph represents the flow rate (vol %) of the additive gas contained in the processing gas. A vertical axis of the graph represents the roundness of the hole. In the graph, plots EX1 to EX8 represent the results of the first experiment to the eighth experiment, respectively. In the first experiment to the fourth experiment, the additive gas is the HCl gas. In the sixth experiment to the eighth experiment, the additive gas is the $Cl_2$ gas.

As can be understood from the plots EX1 to EX5, when the flow rate of the HCl gas is increased, the roundness of the hole is increased. Meanwhile, as can be understood from the plots EX5 to EX8, even when the flow rate of the $Cl_2$ gas is increased, the roundness of the hole is lower than that in the case of the HCl gas.

Therefore, it is understood that when the processing gas contains the HCl gas, the roundness of the hole can be made higher than in the case where the processing gas contains the $Cl_2$ gas.

Third Experiment Result

In the first experiment to the eighth experiment, images of the cross section (cross section in FIG. 8) orthogonal to the depth direction of the holes were observed at the bottom of the circular holes formed in the stacked film by the etching. In the cross section, a bending index value (3σ) indicating a degree of bending of the hole was calculated. When the bending of the hole is large, a variation in distance between centers of the holes is large in the cross section in FIG. 8. When the variation in distance between the centers of the holes is large, the bending index value (3σ) is large. Results are illustrated in FIG. 11.

Figure 11:
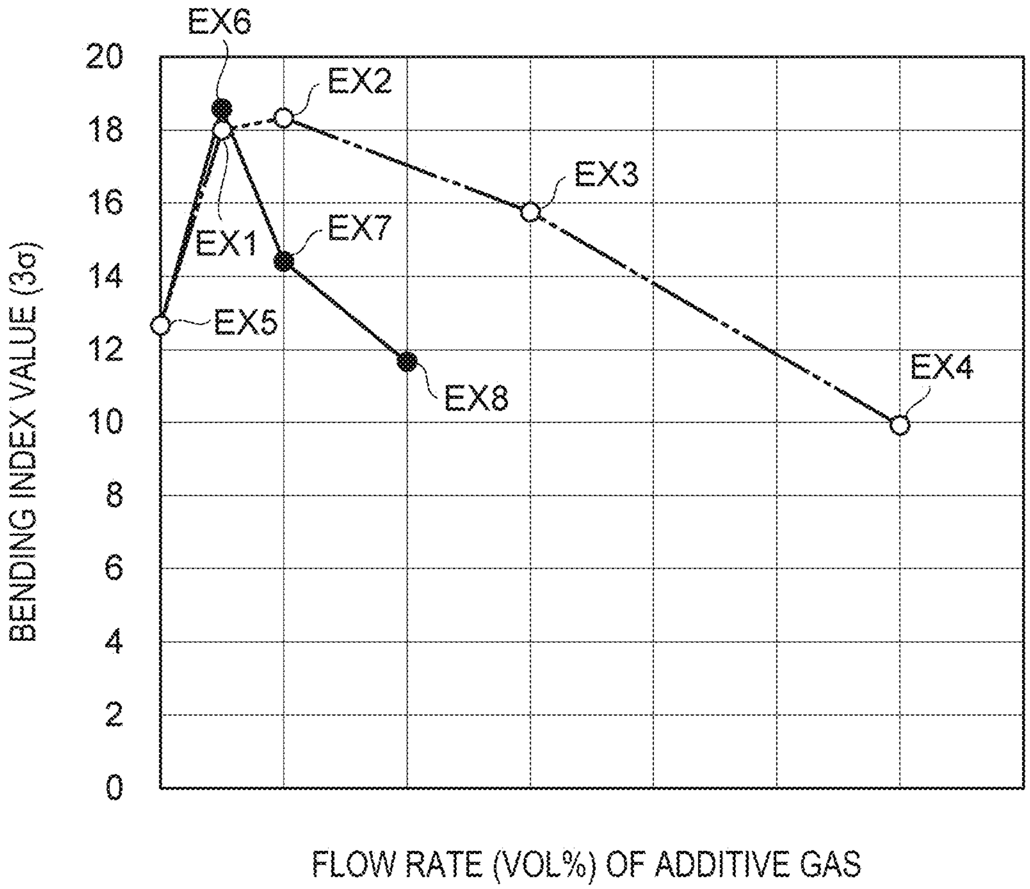
FIG. 11 is a graph illustrating an example of a correlation between the flow rate of the additive gas contained in the processing gas and a bending index value (3σ).

FIG. 11 is a graph illustrating an example of a correlation between the flow rate of the additive gas contained in the processing gas and a bending index value (3σ). A horizontal axis of the graph represents the flow rate (vol %) of the additive gas contained in the processing gas. A vertical axis of the graph represents the bending index value (3σ). In the graph, plots EX1 to EX8 represent the results of the first experiment to the eighth experiment, respectively. In the first experiment to the fourth experiment, the additive gas is the HCl gas. In the sixth experiment to the eighth experiment, the additive gas is the $Cl_2$ gas.

As can be understood from the plots EX1 to EX8, the bending index value is decreased as the flow rate of the HCl gas or the $Cl_2$ gas is increased.

Therefore, it is understood that the bending of the hole can be prevented even when the flow rate of the HCl gas or the $Cl_2$ gas contained in the processing gas is increased.

Ninth Experiment

In a ninth experiment, a substrate including a stacked film in which a silicon oxide film and a silicon nitride film were alternately stacked and a mask on the stacked film was prepared. The mask is a WSi film having a circular opening. Thereafter, Step ST2 was performed on the substrate by using a plasma processing apparatus.

In Step ST2, the stacked film was etched through the opening in the mask by using a plasma generated from a processing gas. The processing gas contains a HF gas and a HCl gas. The proportion of the flow rate of the HCl gas to the total flow rate of the processing gas is 2.4 vol %.

Tenth Experiment

In a tenth experiment, a method same as that in the ninth experiment was performed except that the proportion of the flow rate of the HCl gas to the total flow rate of the processing gas was 5.9 vol %.

Eleventh Experiment

In an eleventh experiment, a method same as that in the ninth experiment was performed except that the proportion of the flow rate of the HCl gas to the total flow rate of the processing gas was 11 vol %.

Twelfth Experiment

In a twelfth experiment, a method same as that in the ninth experiment was performed except that the flow rate of the HCl gas was 0 sccm.

Thirteenth Experiment

In a thirteenth experiment, a method same as that in the twelfth experiment was performed except that the processing gas contained the $Cl_2$ gas and a proportion of a flow rate of the $Cl_2$ gas to the total flow rate of the processing gas was 4.8 vol %.

Fourteenth Experiment

In a fourteenth experiment, a method same as that in the twelfth experiment was performed except that the processing gas contained a $BCl_3$ gas and a proportion of a flow rate of the $BCl_3$ gas to the total flow rate of the processing gas was 2.4 vol %.

Fifteenth Experiment

In a fifteenth experiment, a method same as that in the fourteenth experiment was performed except that the proportion of the flow rate of the $BCl_3$ gas to the total flow rate of the processing gas was 5.9 vol %.

Fourth Experiment Result

Figure 12:
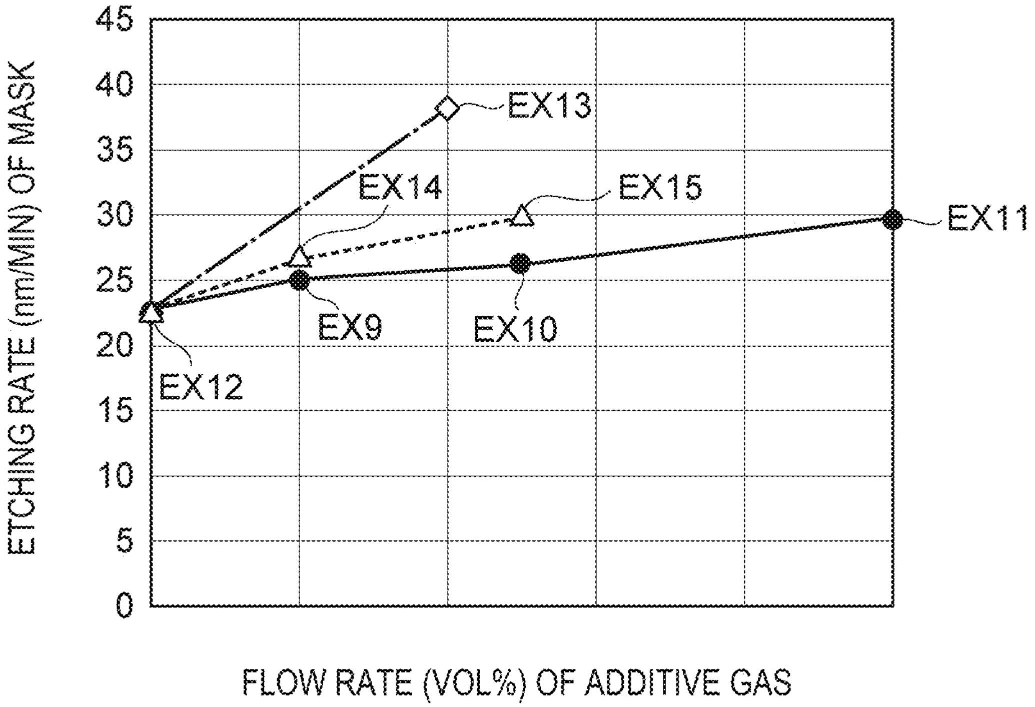
FIG. 12 is a graph illustrating an example of a correlation between the flow rate of the additive gas contained in the processing gas and the etching rate of the mask.

In the ninth experiment to the fifteenth experiment, an etching rate (nm/min) of the mask was calculated by measuring a difference between a first thickness of the mask before the etching and a second thickness of the mask after the etching. Results are illustrated in FIG. 12. In the eleventh experiment, a ratio of the second thickness to the first thickness was 0.48.

FIG. 12 is a graph illustrating an example of a correlation between the flow rate of the additive gas contained in the processing gas and the etching rate of the mask. A horizontal axis of the graph represents the flow rate (vol %) of the additive gas contained in the processing gas. A vertical axis of the graph represents the etching rate (nm/min) of the mask. In the graph, plots EX9 to EX15 represent the results of the ninth experiment to the fifteenth experiment, respectively. In the ninth experiment to the eleventh experiment, the additive gas is the HCl gas. In the thirteenth experiment, the additive gas is the $Cl_2$ gas. In the fourteenth experiment and the fifteenth experiment, the additive gas is the $BCl_3$ gas.

As can be understood from the plots EX9 to EX12, the etching rate of the mask is not so large even when the flow rate of the HCl gas is increased. Meanwhile, as can be understood from the plots EX12 to EX15, when the flow rate of the $Cl_2$ gas or the $BCl_3$ gas is increased, the etching rate of the mask is rapidly increased.

Therefore, it is understood that when the processing gas contains the HCl gas, the etching amount of the mask can be prevented compared to a case where the processing gas contains the $Cl_2$ gas or the $BCl_3$ gas.

Fifth Experiment Result

In the ninth experiment to the fifteenth experiment, an etching selectivity of the stacked film to the mask was calculated by measuring the etching amount of the mask and a depth of the hole formed by the etching. Results are illustrated in FIG. 13.

Figure 13:
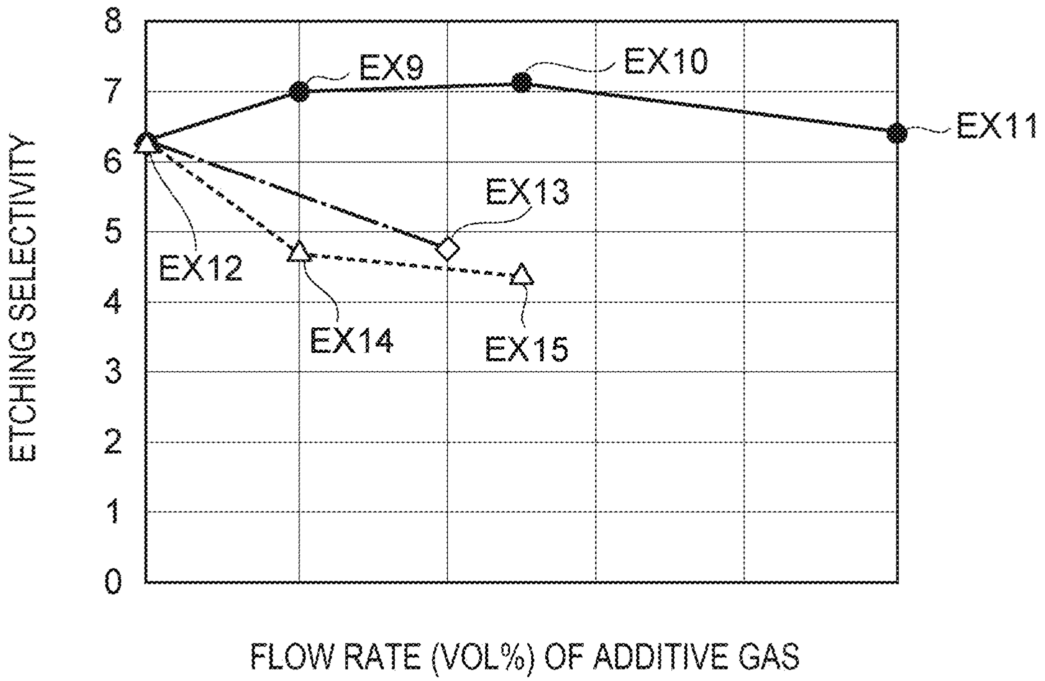
FIG. 13 is a graph illustrating an example of a correlation between the flow rate of the additive gas contained in the processing gas and an etching selectivity.

FIG. 13 is a graph illustrating an example of a correlation between the flow rate of the additive gas contained in the processing gas and an etching selectivity. A horizontal axis of the graph represents the flow rate (vol %) of the additive gas contained in the processing gas. A vertical axis of the graph represents the etching selectivity. In the graph, plots EX9 to EX15 represent the results of the ninth experiment to the fifteenth experiment, respectively. In the ninth experiment to the eleventh experiment, the additive gas is the HCl gas. In the thirteenth experiment, the additive gas is the $Cl_2$ gas. In the fourteenth experiment and the fifteenth experiment, the additive gas is the $BCl_3$ gas.

As can be understood from the plots EX9 to EX12, a decrease in etching selectivity is prevented even when the flow rate of the HCl gas is increased. Meanwhile, as can be understood from the plots EX12 to EX15, when the flow rate of the $Cl_2$ gas or the $BCl_3$ gas is increased, the etching selectivity is decreased.

Therefore, it is understood that when the processing gas contains the HCl gas, the decrease in etching selectivity can be prevented compared to the case where the processing gas contains the $Cl_2$ gas or the $BCl_3$ gas.

Sixth Experiment Result

In the ninth experiment to the fifteenth experiment, the number of blocked openings was counted by observing an image of an upper surface of the mask. Results are illustrated in FIG. 14.

Figure 14:
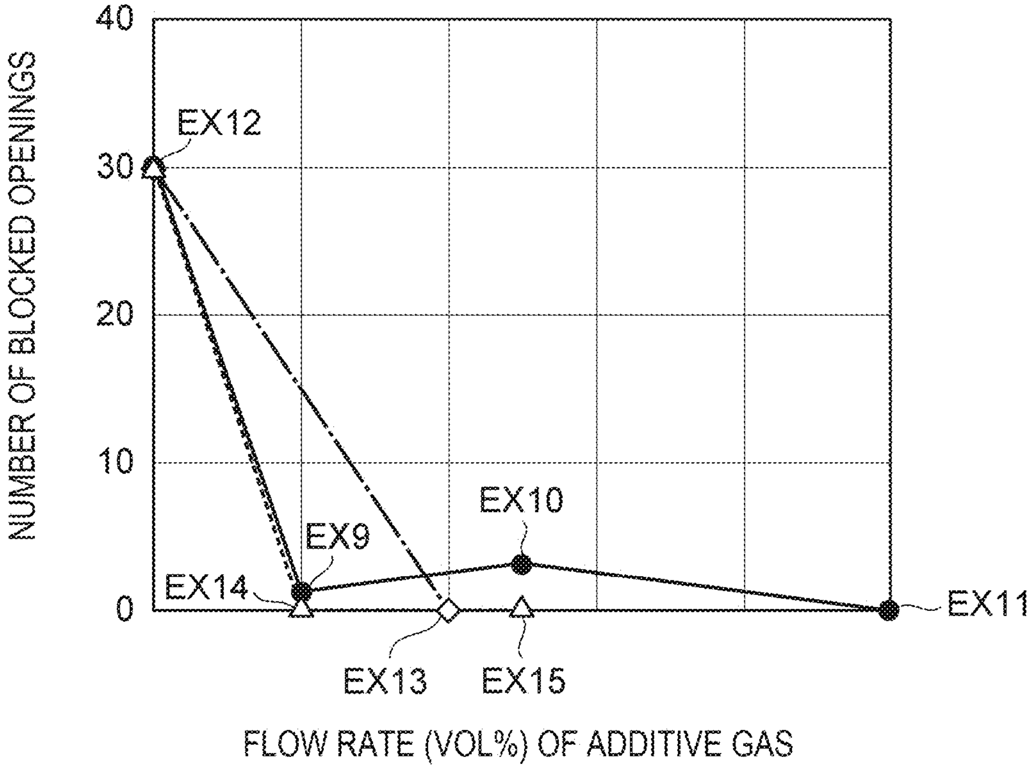
FIG. 14 is a graph illustrating an example of a correlation between the flow rate of the additive gas contained in the processing gas and the number of blocked openings.

FIG. 14 is a graph illustrating an example of a correlation between the flow rate of the additive gas contained in the processing gas and the number of blocked openings. A horizontal axis of the graph represents the flow rate (vol %) of the additive gas contained in the processing gas. A vertical axis of the graph represents the number of blocked openings. In the graph, plots EX9 to EX15 represent the results of the ninth experiment to the fifteenth experiment, respectively. In the ninth experiment to the eleventh experiment, the additive gas is the HCl gas. In the thirteenth experiment, the additive gas is the $Cl_2$ gas. In the fourteenth experiment and the fifteenth experiment, the additive gas is the $BCl_3$ gas.

As can be understood from the plots EX9 to EX15, by adding the HCl gas, the $Cl_2$ gas, or the $BCl_3$ gas, the blockage of the opening of the mask can be prevented.

Therefore, it is understood that when the processing gas contains the HCl gas, the $Cl_2$ gas, or the $BCl_3$ gas, the blockage of the opening of the mask can be prevented.

Seventh Experiment Result

In the ninth experiment to the fifteenth experiment, an etching rate (nm/min) of the stacked film was calculated by measuring the depth of the hole formed by the etching. Results are illustrated in FIG. 15.

Figure 15:
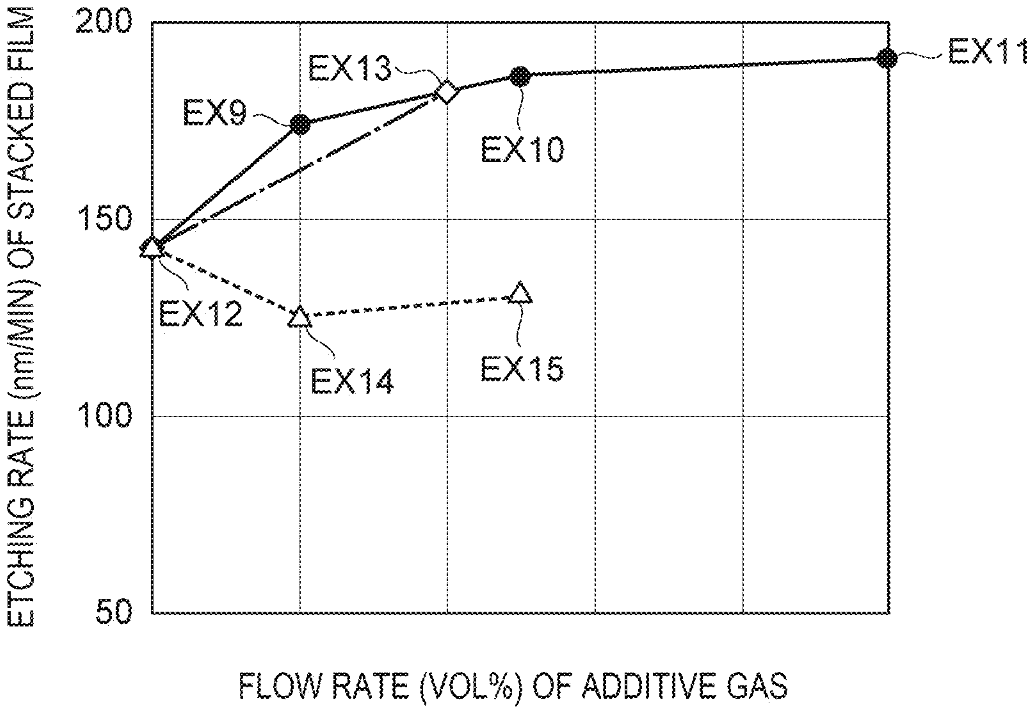
FIG. 15 is a graph illustrating an example of a correlation between the flow rate of the additive gas contained in the processing gas and an etching rate of a stacked film.

FIG. 15 is a graph illustrating an example of a correlation between the flow rate of the additive gas contained in the processing gas and an etching rate of a stacked film. A horizontal axis of the graph represents the flow rate (vol %) of the additive gas contained in the processing gas. A vertical axis of the graph represents the etching rate (nm/min) of the stacked film. In the graph, plots EX9 to EX15 represent the results of the ninth experiment to the fifteenth experiment, respectively. In the ninth experiment to the eleventh experiment, the additive gas is the HCl gas. In the thirteenth experiment, the additive gas is the $Cl_2$ gas. In the fourteenth experiment and the fifteenth experiment, the additive gas is the $BCl_3$ gas.

As can be understood from the plots EX9 to EX13, when the flow rate of the HCl gas or the $Cl_2$ gas is increased, the etching rate of the stacked film is increased. Meanwhile, as can be understood from the plots EX12, EX14, and EX15, when the $BCl_3$ gas is added, the etching rate of the stacked film is reduced.

Therefore, it is understood that when the processing gas contains the HCl gas or the $Cl_2$ gas, the etching rate of the stacked film can be increased.

Eighth Experiment Result

In the ninth experiment to the fifteenth experiment, a dimension CD of the opening of the mask was measured by observing the image of the upper surface of the mask, and a variation in dimension of the opening (a value of a ratio of 3σ to a design dimension of the opening) was calculated. Results are illustrated in FIG. 16.

Figure 16:
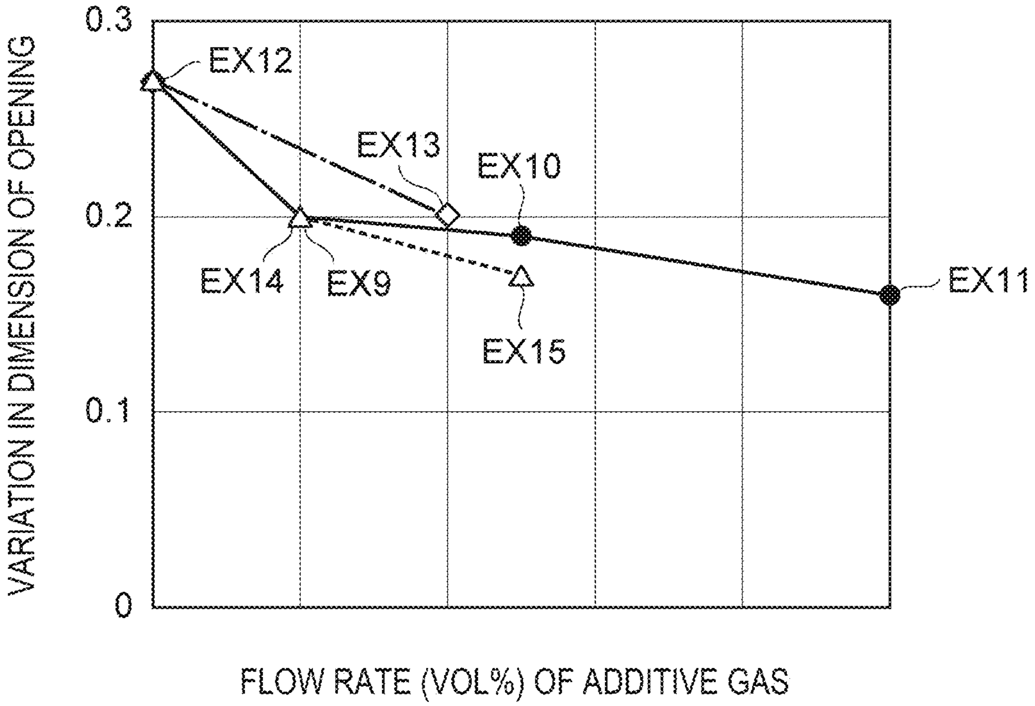
FIG. 16 is a graph illustrating an example of a correlation between the flow rate of the additive gas contained in the processing gas and a variation in dimension of an opening.

FIG. 16 is a graph illustrating an example of a correlation between the flow rate of the additive gas contained in the processing gas and a variation in dimension of an opening. A horizontal axis of the graph represents the flow rate (vol %) of the additive gas contained in the processing gas. A vertical axis of the graph represents the value of the ratio of 3σ to the design dimension of the opening. In the graph, plots EX9 to EX15 represent the results of the ninth experiment to the fifteenth experiment, respectively. In the ninth experiment to the eleventh experiment, the additive gas is the HCl gas. In the thirteenth experiment, the additive gas is the $Cl_2$ gas. In the fourteenth experiment and the fifteenth experiment, the additive gas is the $BCl_3$ gas.

As can be understood from the plots EX9 to EX15, when the flow rate of the HCl gas, the $Cl_2$ gas, or the $BCl_3$ gas is increased, the variation in dimension of the opening is reduced.

Therefore, it is understood that when the processing gas contains the HCl gas, the $Cl_2$ gas, or the $BCl_3$ gas, the variation in dimension of the opening is reduced.

Ninth Experiment Result

In the ninth experiment to the fifteenth experiment, edge roughness (nm) of the opening of the mask was measured by observing the image of the upper surface of the mask. Results are illustrated in FIG. 17.

Figure 17:
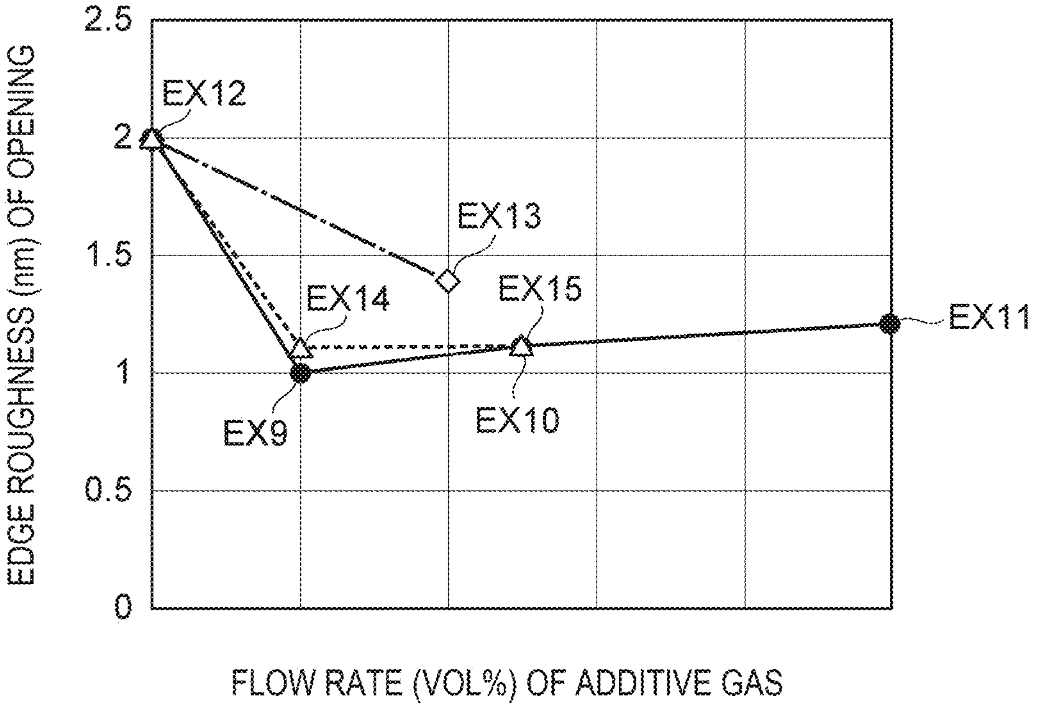
FIG. 17 is a graph illustrating an example of a correlation between the flow rate of the additive gas contained in the processing gas and edge roughness of the opening.

FIG. 17 is a graph illustrating an example of a correlation between the flow rate of the additive gas contained in the processing gas and edge roughness of the opening. A horizontal axis of the graph represents the flow rate (vol %) of the additive gas contained in the processing gas. A vertical axis of the graph represents the edge roughness (nm) of the opening of the mask. In the graph, plots EX9 to EX15 represent the results of the ninth experiment to the fifteenth experiment, respectively. In the ninth experiment to the eleventh experiment, the additive gas is the HCl gas. In the thirteenth experiment, the additive gas is the $Cl_2$ gas. In the fourteenth experiment and the fifteenth experiment, the additive gas is the $BCl_3$ gas.

As can be understood from the plots EX9 to EX15, when the flow rate of the HCl gas, the $Cl_2$ gas, or the $BCl_3$ gas is increased, the edge roughness of the opening of the mask is reduced.

Therefore, it is understood that when the processing gas contains the HCl gas, the $Cl_2$ gas, or the $BCl_3$ gas, the edge roughness of the opening of the mask is reduced.

Hereinafter, various exemplary embodiments included in the present disclosure will be described in [E1] to [E22].

[E1]

An Etching Method Including:

(a) preparing a substrate, the substrate including a first region and a second region below the first region, the first region containing a first material and having at least one opening, the second region containing a second material that is different from the first material and contains silicon; and (b) etching the second region through the at least one opening by using a plasma generated from a processing gas containing a fluorine containing gas and a $C_xH_yCl_z$ (x and y are each an integer of 0 or more, x+y≥1, and z is an integer of 1 or more) gas.

According to the method [E1], in the (b), an etching amount of the first region can be reduced. A mechanism may be considered as follows, and is not limited thereto. A bonding energy between a hydrogen atom (H) and a chlorine atom (Cl) and a bonding energy between a carbon atom (C) and the chlorine atom (Cl) are larger than the bonding energy between the chlorine atom (Cl) and the chlorine atom (Cl). Therefore, chlorine radicals caused by dissociation of the $C_xH_yCl_z$ gas such as a hydrogen chloride gas are unlikely to be generated in the plasma. The chlorine radicals promote the etching of the first region. Since a generation amount of the chlorine radicals in the plasma is smaller than a generation amount of the chlorine radicals in a plasma generated from a chlorine ($Cl_2$) gas, the etching amount of the first region can be reduced.

[E2]

The etching method according to [E1], in which the fluorine containing gas contains a hydrogen fluoride gas.

[E3]

An Etching Method Including:

(a) preparing a substrate, the substrate including a first region and a second region below the first region, the first region containing a first material and having at least one opening, the second region containing a second material that is different from the first material and contains silicon; and (b) etching the second region through the at least one opening by using a plasma generated from a processing gas containing a $C_xH_yCl_z$ (x and y are each an integer of 0 or more, x+y≥1, and z is an integer of 1 or more) gas and a hydrogen halide gas different from a hydrogen chloride gas.

According to the method [E3], similar to the method [E1], in the (b), the etching amount of the first region can be reduced.

[E4]

The etching method according to any one of [E1] to [E3], in which the first material contains at least one selected from the group consisting of carbon, silicon, and a metal.

[E5]

The etching method according to [E4], in which the first material contains a metal.

[E6]

The etching method according to [E5], in which the first material contains at least one metal selected from the group consisting of ruthenium, tungsten, titanium, and molybdenum.

[E7]

The etching method according to any one of [E1] to [E6], in which a proportion of a flow rate of the $C_xH_yCl_z$ gas to a total flow rate of the processing gas is 0.5 vol % to 30 vol %.

[E8]

The etching method according to any one of [E1] to [E7], in which in the (b), a circular hole is formed in the second region by the etching, and in a cross section orthogonal to a depth direction of the hole, roundness of the hole is 0.95 to 1.

[E9]

The etching method according to any one of [E1] to [E8], in which the first region has a first thickness before the (b), the first region has a second thickness after the (b), and a ratio of the second thickness to the first thickness is 0.4 to 0.9.

[E10]

The etching method according to any one of [E1] to [E9], in which a dimension of the at least one opening is 5 nm to 200 nm.

[E11]

The etching method according to any one of [E1] to [E10], further including: (c) supplying hydrogen fluoride to the substrate under a pressure of 13.3 Pa or more after the (b).

[E12]

The etching method according to any one of [E1] to [E11], in which the second material further contains nitrogen.

[E13]

The etching method according to any one of [E1] to [E12], in which the (b) is started in a state where a temperature of a substrate support configured to support the substrate is set to 0° C. or lower.

[E14]

The etching method according to any one of [E1] to [E13], in which the (b) includes (b1) etching the second region in a state where a temperature of a substrate support configured to support the substrate is set to a first temperature, and (b2) etching the second region in a state where the temperature of the substrate support is set to a second temperature different from the first temperature.

[E15]

The etching method according to [E14], in which the first temperature is lower than the second temperature.

[E16]

The etching method according to [E14], in which the first temperature is higher than the second temperature.

[E17]

The etching method according to any one of [E14] to [E16], in which the (b1) and the (b2) are alternately repeated.

[E18]

The Etching Method According to any One of [E1] to [E17], in which the second region includes a first silicon containing layer and a second silicon containing layer, and the (b) includes (b3) etching the first silicon containing layer by using a plasma generated from a first processing gas containing the fluorine containing gas and the $C_xH_yCl_z$ gas, and (b4) etching the second silicon containing layer by using a second processing gas containing the fluorine containing gas, the second processing gas not containing the $C_xH_yCl_z$ gas or containing the $C_xH_yCl_z$ gas having a flow rate smaller than a flow rate of the $C_xH_yCl_z$ gas contained in the first processing gas.

[E19]

The etching method according to any one of [E1] to [E18], in which the second region includes at least two layers selected from the group consisting of a first silicon containing layer containing silicon and nitrogen, a second silicon containing layer containing silicon and oxygen, and a third silicon containing layer containing polysilicon.

[E20]

An Etching Method Including:

(a) preparing a substrate, the substrate including a first region and a second region below the first region, the first region containing a first material and having at least one opening, the second region containing a second material that is different from the first material and contains silicon: and (b) etching the second region through the at least one opening by using a plasma generated from a processing gas containing a fluorine containing gas and a compound having an interatomic bond having a bonding energy larger than a bonding energy between a chlorine atom and a chlorine atom.

According to the method [E20], in the (b), the etching amount of the first region can be reduced. A mechanism may be considered as follows, and is not limited thereto. The compound contained in the processing gas has the interatomic bond having the bonding energy larger than the bonding energy between the chlorine atom (Cl) and the chlorine atom (Cl). Therefore, radicals caused by dissociation of the compound are unlikely to be generated in the plasma. The radicals promote the etching of the first region. Since a generation amount of the radicals in the plasma is smaller than a generation amount of the chlorine radicals in a plasma generated from the chlorine ($Cl_2$) gas, the etching amount of the first region can be reduced.

[E21]

The etching method according to [E20], in which the compound is a chlorine containing compound.

[E22]

A Plasma Processing Apparatus Including:

a chamber;

a substrate support configured to support a substrate in the chamber, the substrate including a first region and a second region below the first region, the first region containing a first material and having at least one opening, the second region containing a second material that is different from the first material and contains silicon;

a gas supply configured to supply a processing gas containing a fluorine containing gas and a $C_xH_yCl_z$ (x and y are each an integer of 0 or more, x+y≥1, and z is an integer of 1 or more) gas into the chamber;

a plasma generator configured to generate a plasma from the processing gas in the chamber; and a controller, the controller being configured to control the gas supply and the plasma generator to etch the second region through the at least one opening by using the plasma.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. An etching method comprising:

(a) preparing a substrate, the substrate including a first region and a second region below the first region, the first region containing a first material and having at least one opening, the second region containing a second material that is different from the first material and contains silicon; and (b) etching the second region through the at least one opening by using a plasma generated from a processing gas containing a fluorine containing gas and a $C_xH_yCl_z$ (x and y are each an integer of 0 or more, x+y≥1, and z is an integer of 1 or more) gas, wherein a proportion of a flow rate of the $C_xH_yCl_z$ gas to a total flow rate of the processing gas is 0.5 vol % to 30 vol %, and the first region has a first thickness before the (b), the first region has a second thickness after the (b), and a ratio of the second thickness to the first thickness is 0.4 to 0.9.

2. The etching method according to claim 1, wherein in the (b), a circular hole is formed in the second region by the etching, and in a cross section orthogonal to a depth direction of the hole, roundness of the hole is 0.95 to 1.

3. The etching method according to claim 1, wherein a dimension of the at least one opening is 5 nm to 200 nm.

4. The etching method according to claim 1, further comprising:

(c) supplying hydrogen fluoride to the substrate under a pressure of 13.3 Pa or more after the (b).

5. The etching method according to claim 1, wherein the $C_xH_yCl_z$ gas contains at least one selected from the group consisting of a dichloromethane ($CH_2Cl_2$) gas and a chloroform ($CHCl_3$) gas.

6. The etching method according to claim 1, wherein the first thickness is 500 nm or more.

7. The etching method according to claim 1, wherein the fluorine containing gas contains a hydrogen fluoride gas, a phosphorus fluoride gas, and a bromofluorocarbon gas.

8. The etching method according to claim 1, wherein the first material contains at least one selected from the group consisting of carbon, silicon, and a metal.

9. The etching method according to claim 8, wherein the first material contains a metal.

10. The etching method according to claim 9, wherein the first material contains at least one metal selected from the group consisting of ruthenium, tungsten, titanium, and molybdenum.

11. The etching method according to claim 1, wherein the fluorine containing gas contains a hydrogen fluoride gas.

12. The etching method according to claim 11, wherein the second material further contains nitrogen.

13. The etching method according to claim 12, wherein the (b) is started in a state where a temperature of a substrate support configured to support the substrate is set to 0° C. or lower.

14. The etching method according to claim 12, wherein the second region includes a first silicon containing layer and a second silicon containing layer, and the (b) includes (b3) etching the first silicon containing layer by using a plasma generated from a first processing gas containing the fluorine containing gas and the $C_xH_yCl_z$ gas, and (b4) etching the second silicon containing layer by using a second processing gas containing the fluorine containing gas, the second processing gas not containing the $C_xH_yCl_z$ gas or containing the $C_xH_yCl_z$ gas having a flow rate smaller than a flow rate of the $C_xH_yCl_z$ gas contained in the first processing gas.

15. The etching method according to claim 12, wherein the second region includes at least two layers selected from the group consisting of a first silicon containing layer containing silicon and nitrogen, a second silicon containing layer containing silicon and oxygen, and a third silicon containing layer containing polysilicon.

16. The etching method according to claim 12, wherein the (b) includes (b1) etching the second region in a state where a temperature of a substrate support configured to support the substrate is set to a first temperature, and (b2) etching the second region in a state where the temperature of the substrate support is set to a second temperature different from the first temperature.

17. The etching method according to claim 16, wherein the first temperature is lower than the second temperature.

18. The etching method according to claim 16, wherein the first temperature is higher than the second temperature.

19. The etching method according to claim 16, wherein the (b1) and the (b2) are alternately repeated.

20. An etching method comprising:

(a) preparing a substrate, the substrate including a first region and a second region below the first region, the first region containing a first material and having at least one opening, the second region containing a second material that is different from the first material and contains silicon; and (b) etching the second region through the at least one opening by using a plasma generated from a processing gas containing a $C_xH_yCl_z$ (x is an integer of 1 or more, y is an integer of 0 or more, and z is an integer of 1 or more) gas and a hydrogen halide gas different from a hydrogen chloride gas, wherein a proportion of a flow rate of the $C_xH_yCl_z$ gas to a total flow rate of the processing gas is 0.5 vol % to 30 vol %, and the first region has a first thickness before the (b), the first region has a second thickness after the (b), and a ratio of the second thickness to the first thickness is 0.4 to 0.9.

* * * * *